(12) United States Patent
Choi et al.

(10) Patent No.: US 8,370,611 B2
(45) Date of Patent: Feb. 5, 2013

(54) MEMORY CARD, MEMORY SYSTEM INCLUDING THE SAME, AND OPERATING METHOD THEREOF

(75) Inventors: Sung-Up Choi, Hwaseong-si (KR); Se-Jin Ahn, Seoul (KR); Yong-Hyeon Kim, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 919 days.

(21) Appl. No.: 12/046,888

(22) Filed: Mar. 12, 2008

(65) Prior Publication Data

US 2008/0229090 A1 Sep. 18, 2008

(30) Foreign Application Priority Data

Mar. 14, 2007 (KR) ........................ 10-2007-0025211

(51) Int. Cl.
*G06F 15/177* (2006.01)
*G06F 12/00* (2006.01)
*G06F 9/00* (2006.01)
*G06F 12/02* (2006.01)

(52) U.S. Cl. ................ 713/2; 713/1; 713/100; 711/100; 711/103; 711/E12.008; 710/8; 710/9; 710/10; 710/13

(58) Field of Classification Search .................. 713/1, 2, 713/100; 711/100, 103, E12.008; 710/8–14
See application file for complete search history.

(56) References Cited

U.S. PATENT DOCUMENTS

| | | | |
|---|---|---|---|
| 7,702,984 B1 * | 4/2010 | Lee et al. ........................ | 714/742 |
| 7,873,837 B1 * | 1/2011 | Lee et al. ........................ | 713/189 |
| 2003/0110361 A1 * | 6/2003 | Kanehira et al. ............... | 711/154 |
| 2003/0182496 A1 * | 9/2003 | Yoo ................................ | 711/103 |
| 2005/0036372 A1 * | 2/2005 | Sasaki ............................ | 365/202 |
| 2006/0064576 A1 | 3/2006 | Chen | |
| 2006/0245274 A1 * | 11/2006 | Choi et al. ............... | 365/189.12 |
| 2007/0130416 A1 * | 6/2007 | Yada et al. ..................... | 711/103 |
| 2007/0239977 A1 * | 10/2007 | Wu ................................. | 713/2 |
| 2007/0266202 A1 * | 11/2007 | Mukaida ........................ | 711/103 |

FOREIGN PATENT DOCUMENTS

| | | |
|---|---|---|
| CN | 1534685 | 10/2004 |
| CN | 1748198 | 3/2006 |
| JP | 2001-188701 | 7/2001 |
| KR | 1020050030987 | 4/2005 |
| KR | 1020060031192 | 4/2006 |

OTHER PUBLICATIONS

English Abstract for Publication No. 2001-188701.
English Abstract for Publication No. 1020050030987.
English Abstract for Publication No. 1020060031192.
English Abstract for Publication No. CN 1534685.
English Abstract for Publication No. CN 1748198.

* cited by examiner

*Primary Examiner* — Fahmida Rahman
(74) *Attorney, Agent, or Firm* — F. Chau & Associates, LLC

(57) ABSTRACT

Provided is a memory card device. The memory card device includes a flash memory and a controller. The flash memory includes a boot area storing boot data, and a user area storing user data. The controller accesses the boot area or the user area according to an external command. Boot data can be stored in a memory card integrated in an electronic device. Also, when a host requests an access to boot data/user data stored in the memory card, the boot data/user data can be accessed under control of the controller.

20 Claims, 6 Drawing Sheets

MEMORY CARD, MEMORY SYSTEM INCLUDING THE SAME, AND OPERATING METHOD THEREOF

CROSS-REFERENCE TO RELATED APPLICATIONS

This application claims priority under 35 U.S.C. §119 to Korean Patent Application No. 10-2007-0025211, filed on Mar. 14, 2007, the entire contents of which are hereby incorporated by reference.

BACKGROUND OF THE INVENTION

1. Technical Field

The present invention disclosed herein relates to a memory card device, and more particularly, to a memory card, a memory system including the memory card, and a method for operating the memory card.

A flash memory device is a non-volatile memory device which does not require power to maintain information in a memory chip. While flash memory devices may be slower than dynamic random access memory (DRAM) used as a main memory for a personal computer (PC), flash memory has a relatively fast reading speed and is less susceptible to damage cause by impact compared to a hard disk drive (HDD). With these characteristics, flash memory is widely used as a storage device for battery-operated devices. Another feature of flash memory is that it is substantially impervious to adverse conditions such as high pressure and immersion in boiling water.

In flash memory devices, data can be electrically erased and rewritten. Unlike an electrically erasable programmable read only memory (EEPROM), flash memory devices are relatively inexpensive. Accordingly, flash memory is primarily used where a large capacity non-volatile solid-state storage device is required. Flash memory is used in devices such as digital music players, digital cameras, and cellular phones. Another example of a device that uses flash memory is the universal serial bus (USB) drive, widely used for the purpose of storing general data and transmitting data between computers.

Recently, secure digital (SD) cards and multimedia cards (MMC) including flash memory are widely distributed. The MMC is a relatively low priced data storing and communication medium. The MMC is designed to cover a wide range of applications such as smart phones, cameras, personal digital assistants (PDAs), digital recorders, MP3 players, and pagers. Examples of the characteristics of the MMC include high mobility and high performance at a low price. These characteristics include low power consumption and extensive data processing at a memory card interface.

SUMMARY OF THE INVENTION

Exemplary embodiments of the present invention provide an approach for storing boot data in a memory card in electronic devices.

Exemplary embodiments of the present invention also provide an approach for accessing a memory card storing boot data.

Exemplary embodiments of the present invention provide memory card devices including a flash memory including a boot area for storing boot data, and a user area for storing user data and a controller for accessing one of the boot area and the user area in response to a command input from an outside.

In some exemplary embodiments, the user area may include a master boot record area for storing a master boot file, a partition boot record area designated by the master boot file and storing partition boot information, and a file allocation table area designated by file boot information.

In some exemplary embodiments, a logical address of the boot area may be the same as a logical address of a portion of the user area.

In some exemplary embodiments, a start logical address of the boot area may be the same as that of the master boot record area.

In some exemplary embodiments, the controller may generate a logical address for accessing the boot area when the command input from the outside is a command for accessing the boot area.

In some exemplary embodiments, the controller may generate a logical address for accessing the user area when the command input from the outside is a command for accessing the user area.

In some exemplary embodiments, the memory card may be a built-in memory card.

In some exemplary embodiments of the present invention, memory card systems include a host and a memory card accessed by the host. The memory card includes a flash memory including a boot area for storing boot data, and a user area for storing user data; and a controller for accessing either the boot area or the user area in response to a command input from the host.

In some exemplary embodiments, the user area may include a master boot record area for storing a master boot file, a partition boot record area designated by the master boot file and storing partition boot information, and a file allocation table area designated by file boot information.

In some exemplary embodiments, the controller may generate a logical address for accessing the boot area when the command input from the outside is a command for accessing the boot area.

In some exemplary embodiments, the controller may generate a logical address for accessing the user area when the command input from the outside is a command for accessing the user area.

Some exemplary embodiments of the present invention relate to methods for controlling a host for accessing a memory card including a flash memory including a boot area for storing boot data, and a user area for storing user data. The methods include setting the memory card to a transfer state, setting the memory card to a boot mode, and transmitting a write command, data, and an address to be written on the boot area to the memory card.

In some exemplary embodiments, the methods may further include, after the transmitting of the write command, setting the memory card to a normal mode.

In some exemplary embodiment, the methods may further include transmitting a read command and a read address for accessing the boot area to the memory card.

Some exemplary embodiments of the present invention relate to methods for operating a memory card operating in response to a command input from a host. The memory card includes a flash memory including a boot area for storing boot data, and a user area for storing user data. The methods include receiving an access command and an address from the host and providing access to the boot area when the access command is a command for accessing the boot area.

In some exemplary embodiments, providing access to the boot area may include converting the address into a logical address of the boot area when the access command is a command for accessing the boot area and executing the access to the boot area.

In some exemplary embodiments, the method may further include converting the address into a logical address of the user area when the access command is a command for accessing the user area and providing access to the user area.

In some exemplary embodiments, the access command may include a write command or a read command for the flash memory.

In some exemplary embodiments, the access command may include a boot mode set command for accessing the boot area, the write command, or the read command.

In some exemplary embodiments, the access command may include a normal mode set command for accessing the user area, the write command or the read command for the flash memory.

BRIEF DESCRIPTION OF THE FIGURES

The accompanying figures are included to provide a further understanding of exemplary embodiments of the present invention, and are incorporated in and constitute a part of this specification. In the figures.

DETAILED DESCRIPTION OF EXEMPLARY EMBODIMENTS

Exemplary embodiments of the present invention will be described below in more detail with reference to the accompanying drawings. The present invention may, however, be embodied in different forms and should not be constructed as limited to the embodiments set forth herein.

Figure 1:
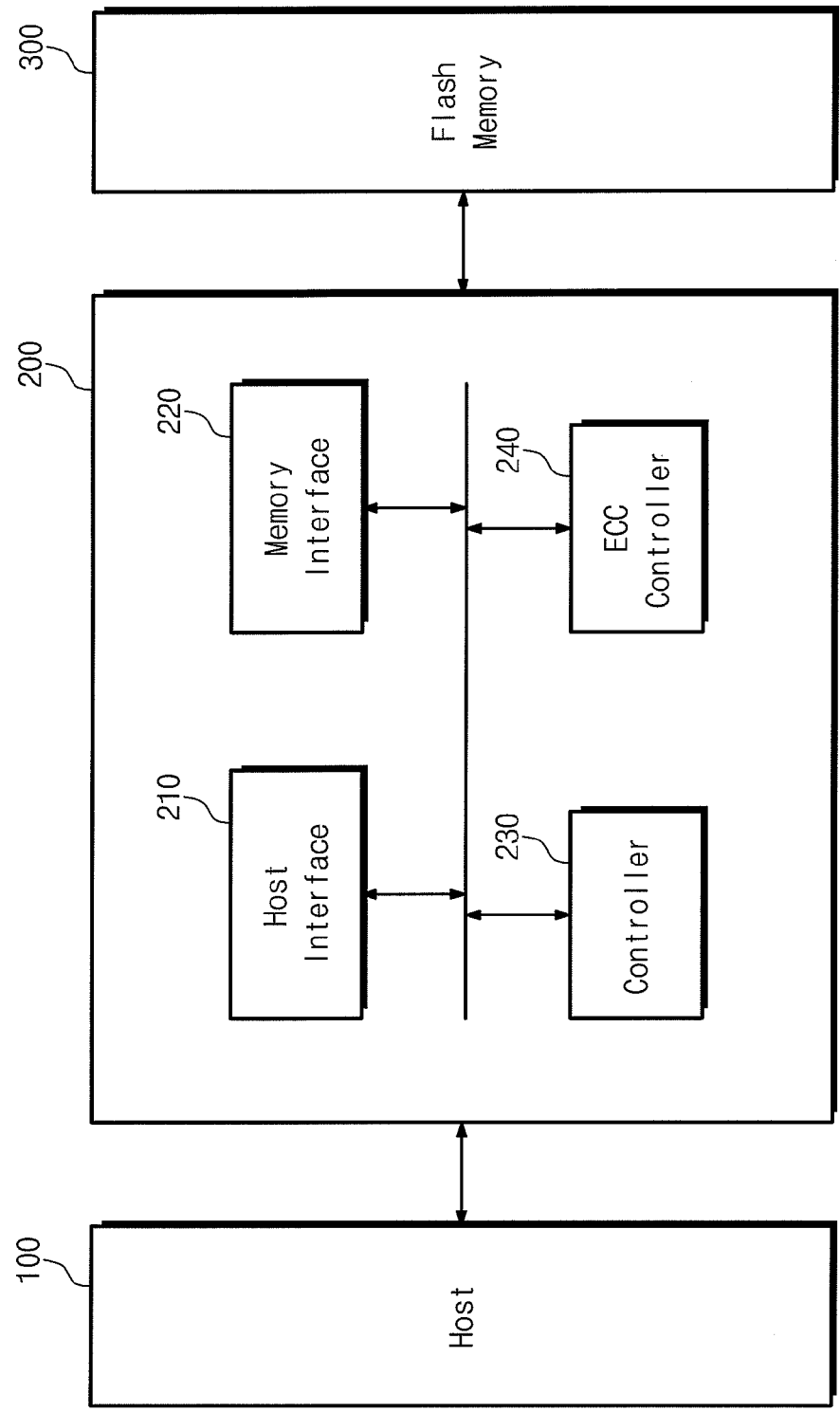
FIG. 1 is a block diagram of a memory system according to an exemplary embodiment of the present invention.

FIG. 1 is a block diagram of a memory system according to an exemplary embodiment of the present invention. Referring to FIG. 1, a memory device includes a memory controller 200 and a flash memory 300. The flash memory 300 operates under the control of the memory controller 200. The flash memory 300 can be a non-volatile memory device such as a NAND flash memory device, a NOR flash memory device, a phase change random access memory device, and/or a magnetic random access memory device.

The memory controller 200 controls the flash memory 300 according to a request of a host 100. The memory controller 200 includes a host interface 210, a memory interface 220, a controller 230, and an error control code (ECC) controller 240. The host interface 210 provides an interface with the host 100, and the memory interface 220 provides an interface with the flash memory 300. The controller 230 can be a processor for controlling an overall operation of the memory controller 200. The host 100 and the memory controller 200 are configured to communicate with each other through various communication interfaces such as a peripheral component interconnect (PCI) and/or a USB. Also, in the case where a memory device including the memory controller 200 and the flash memory 300 is embedded in the host 100, the memory controller 200 can be directly connected to the host 100.

The memory controller 200 and the flash memory 300 are configured to communicate with each other through the well-known NAND/NOR interface. The memory system including the memory controller 200 and the flash memory 300 can be a memory card such as a flash memory card, a smart card, an SD card, or an MMC.

The ECC controller 240 is configured to generate ECC data for data to be stored in the flash memory 300. The ECC data is used for detecting and/or correcting an error. The ECC controller 240 detects and corrects an error of data read from the flash memory 300.

The flash memory 300 of exemplary embodiments of the present invention includes a boot area for storing boot data, and a user area for storing user data. The controller 230 of exemplary embodiments of the present invention accesses the boot area or the user area according to a command input from the host 100.

Figure 2:
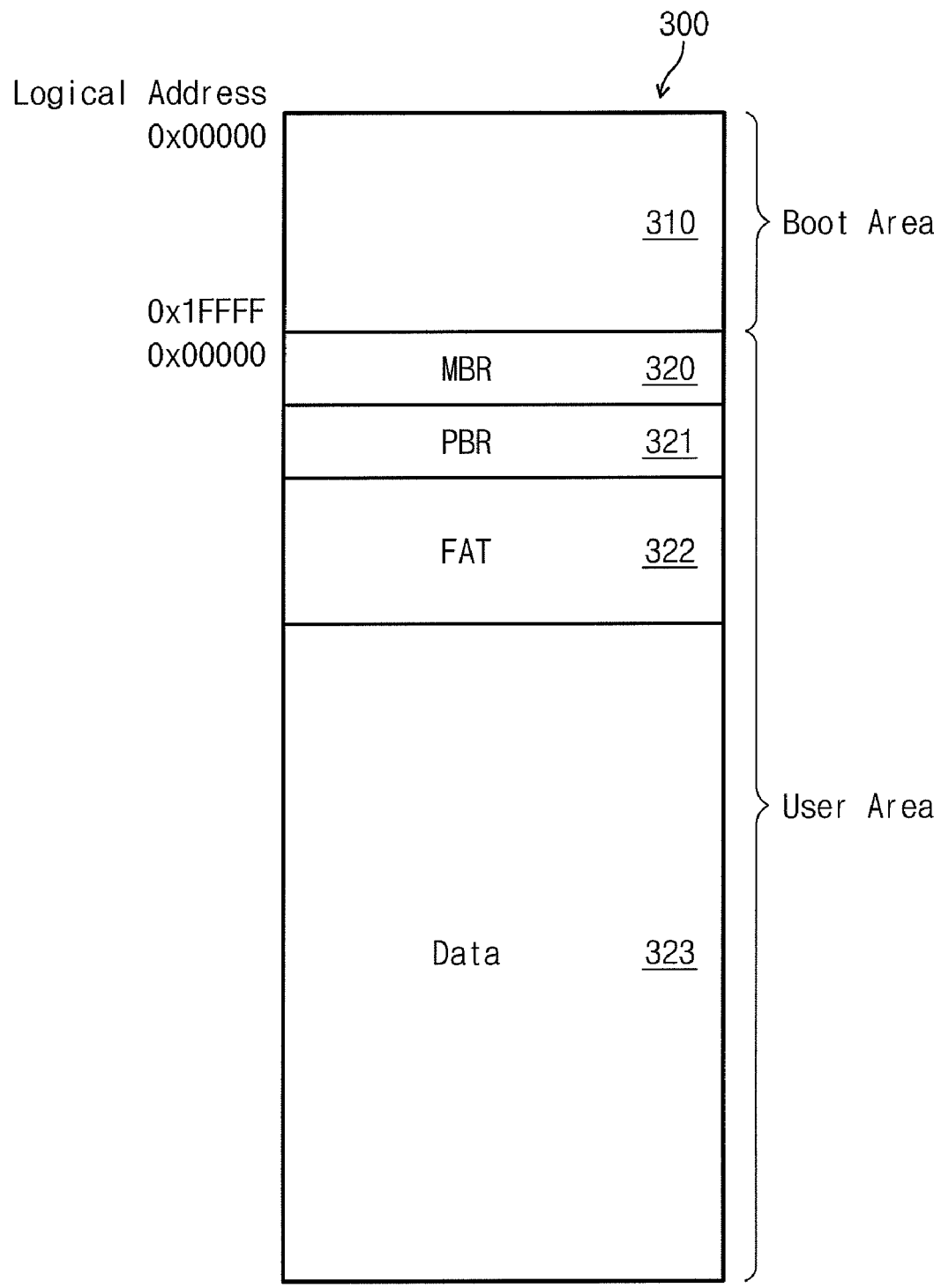
FIG. 2 is a view illustrating the structure of a flash memory according to an exemplary embodiment of the present invention.

FIG. 2 is a view illustrating the structure of a flash memory according to an exemplary embodiment of the present invention.

Referring to FIG. 2, the flash memory 300 includes the boot area 310 and the user area. The user area includes a master boot record (MBR) area 320, a partition boot record (PBR) area 321, a file allocation table (FAT) area 322, and a data area 323.

As is well known in the art, the master boot file is located at a zeroth sector of a hard disk drive (HDD). Likewise, a master boot file stored in the flash memory 300 is stored in a logical address starting from 0x0000 of the flash memory 300. The master boot file inside the MBR area 320 designates a start logical address of the PBR area 321. Partition boot data inside the PBR area 321 designates a start logical address of the FAT area 322. A data area 323 excluding the MBR area 320, the PBR area 321, and the FAT area 322 is used for designating user data.

The flash memory 300 according to exemplary embodiments of the present invention includes a boot area 310 for designating a boot code as well as the user area. The boot area 310 of the flash memory 300 can be accessed by a boot file request command from the host 100, or a predetermined access command. In this exemplary embodiment, the start logical address of the boot area 310 of the flash memory 320 is 0x00000, which is the same as the start logical address of the MBR area 320. However, physical addresses at which the boot area 310 and the MBR area 320 are actually stored in the flash memory 300 are different from each other. In an exemplary embodiment, the start logical address of the boot area 310 can be designed to have a specific logical address, not 0x00000.

Figure 3:
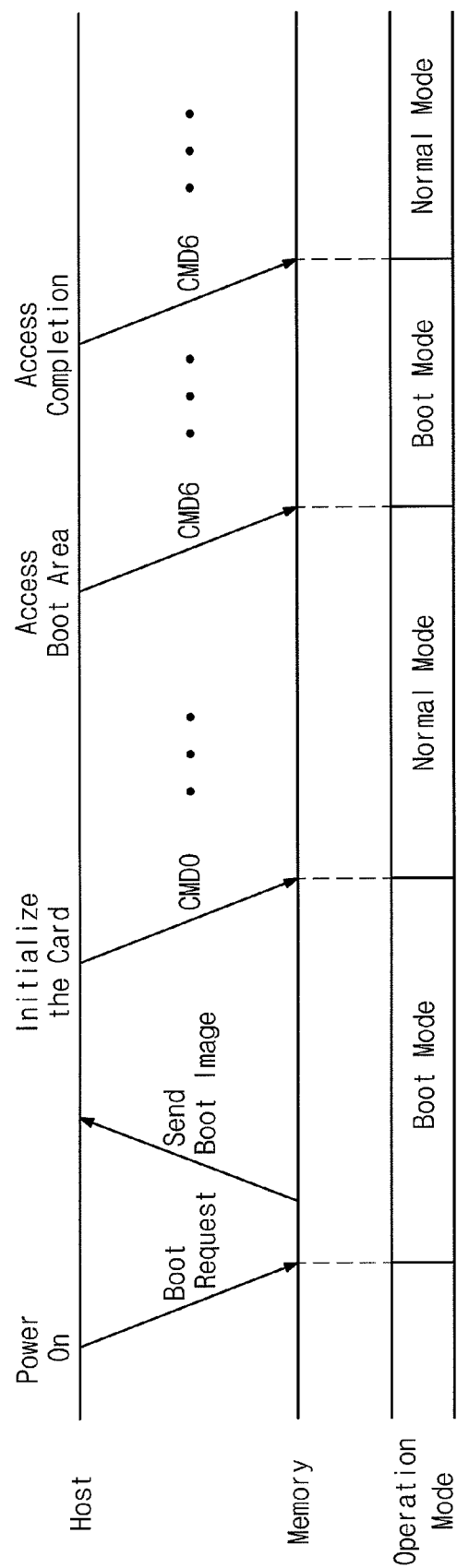
FIG. 3 is a conceptual view illustrating an operation mode of a memory controller when a flash memory is accessed by a host.

FIG. 3 is a conceptual view illustrating an operation mode of the memory controller 200 when the flash memory 300 is accessed by the host 100. When power is on and the host 100 requests a boot code from the memory controller 200, the operation mode of the memory controller 200 is set to a boot mode. The memory controller 200 reads a boot code image stored in the boot area 310 of the flash memory 300 in response to the boot code from the host 100, and transmits the boot code image to the host 100.

After the booting operation of the host 100 is performed completely, a command CMD0 for initializing the flash memory 300 is transmitted to the memory controller 200, and the operation mode of the memory controller 200 is set to a normal mode.

The memory controller 200 accesses the user area of the flash memory 300 in response to a read/write command input from the host 100 during the normal mode.

In the case where the host 100 needs to access the boot area 310 of the flash memory 300, the host 100 transmits a mode change command CMD6 to the memory controller 200. When the mode change command CMD6 is received, the memory controller 200 changes an operation mode to a boot mode and then accesses the boot area 310 in response to a read/write command input from the host 100.

In the case where the host 100 intends to stop an access to the boot area 310 of the flash memory 300, the host 100 transmits a mode change command CMD6 to the memory controller 200. The memory controller 200 changes an operation mode to a normal mode in response to the mode change command CMD6 and then access the user area of the flash memory 300 in response to a read/write command input from the host 100.

A boot code stored in the flash memory 300 can be accessed according to the above-described scheme.

Figure 4:
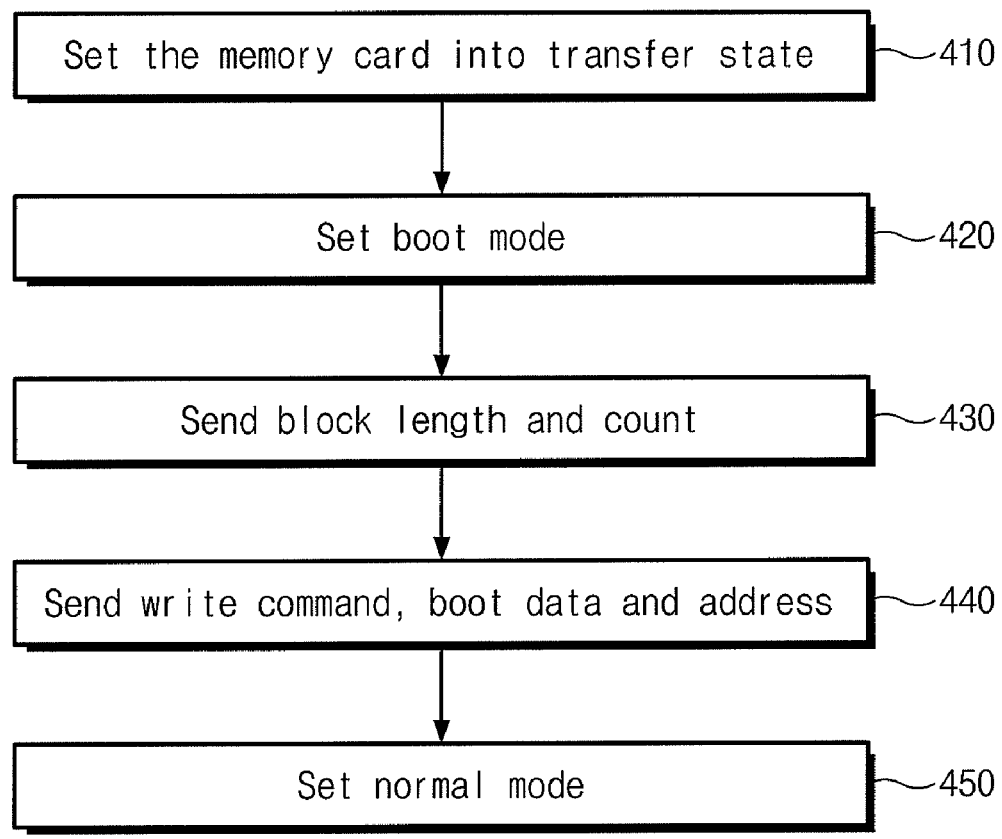
FIG. 4 is a flowchart illustrating a control sequence for allowing a host to write a boot code on a boot area of a flash memory according to an exemplary embodiment of the present invention.

FIG. 4 is a flowchart illustrating a control sequence for allowing the host 100 to write a boot code on the boot area 310 of the flash memory 300 according to an exemplary embodiment of the present invention.

Referring to FIG. 4, the host 100 transmits a command for setting a memory card to a transfer state (Step 410). The memory controller 200 makes a transition from a stand-by state to a transfer state in response to the command of the host 100.

The host 100 transmits a command for setting the memory controller 200 to a boot mode (Step 420). Examples of commands for setting a boot mode include a boot code request command and a mode change command CMD6, for example, as illustrated in FIG. 3. The memory controller 200 is set to a boot mode in response to a command from the host 100.

The host 100 transmits information regarding the block length of a boot code written on the boot area 310 and the number of blocks to the memory controller 200 (Step 430).

The host 100 transmits a write command, a boot code, and an address to the memory controller 200 to write a boot code on the boot area 310 (Step 440). The memory controller 200 writes the boot code on the boot area 310 of the flash memory 300 in response to information regarding the block length of the boot code received from the host 100, the number of blocks, a write command, the boot code, and an address.

When the memory controller 200 completes writing the boot code on the boot area 310 of the flash memory 300, the host 100 transmits a command for setting the operation mode of the memory controller 200 to a normal mode to the memory controller 200 (Step 450). Through the above process, the host 100 can write the boot code on the boot area 310 of the flash memory 300.

Figure 5:
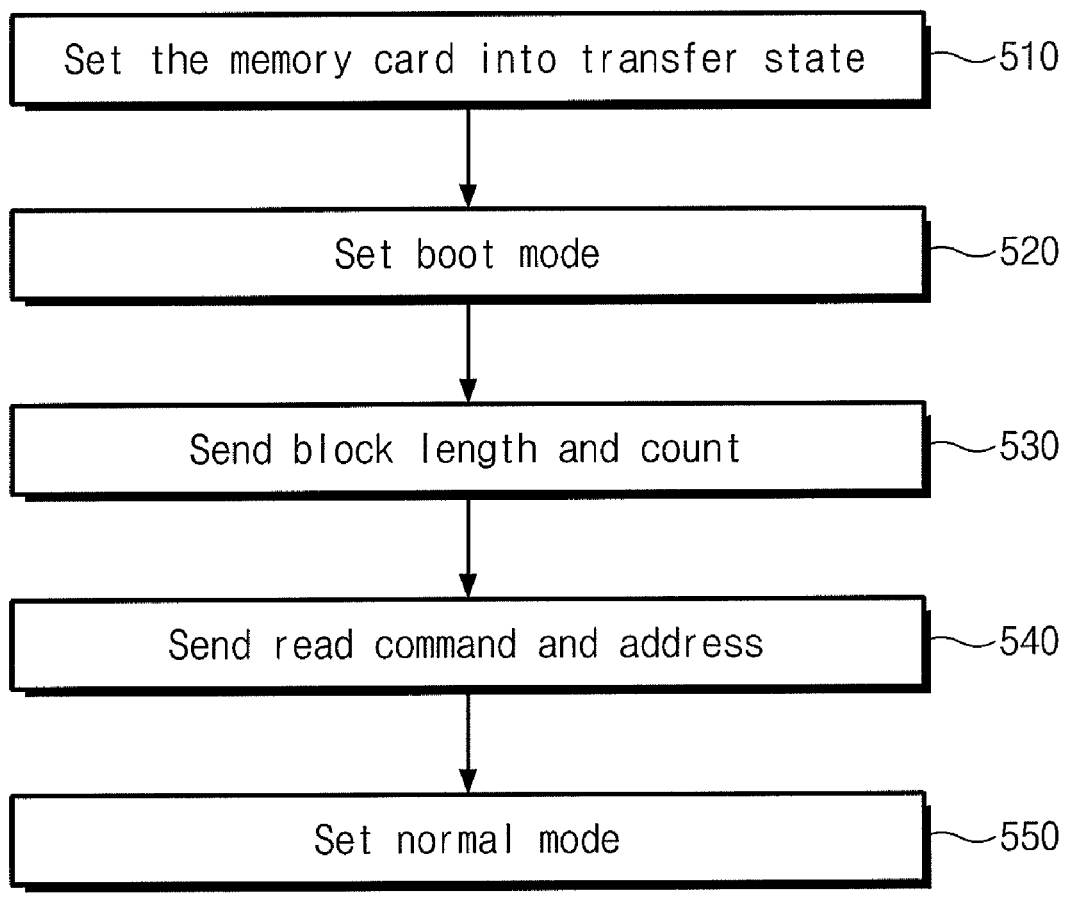
FIG. 5 is a flowchart illustrating a control sequence for allowing a host to read a boot code stored in a boot area of a flash memory according to an exemplary embodiment of the present invention.

FIG. 5 is a flowchart illustrating a control sequence for allowing the host 100 to read a boot code stored in the boot area 310 of the flash memory 300 according to an exemplary embodiment of the present invention.

Referring to FIG. 5, the host 100 transmits a command for setting a memory card to a transfer state (Step 510). The memory controller 200 makes a transition from a stand-by state to a transfer state in response to the command of the host 100.

The host 100 transmits a command for setting the memory controller 200 to a boot mode (Step 520). Examples of commands for setting a boot mode include a boot code request command and a mode change command CMD6 illustrated in FIG. 3. The memory controller 200 is set to a boot mode in response to a command from the host 100.

The host 100 transmits information regarding the block length of a boot code to be read from the boot area 310 and the number of blocks to the memory controller 200 (Step 530).

The host 100 transmits a read command, a boot code and an address to the memory controller 200 to read a boot code from the boot area 310 (Step 540). The memory controller 200 reads the boot code from the boot area 310 of the flash memory 300 in response to information regarding the block length of the boot code received from the host 100, the number of blocks, a read command, and an address.

When the memory controller 200 completes reading the boot code from the boot area 310 of the flash memory, the host 100 transmits a command for setting the operation mode of the memory controller 200 to a normal mode to the memory controller 200 (Step 550). Through the above process, the host 100 can read the boot code from the boot area 310 of the flash memory 300.

Methods for allowing the host 100 to read a boot code from the boot area 310 of the flash memory 300 are not limited to the method illustrated in FIG. 5. For example, an entire boot code of the boot area 310 can be transmitted to the host 100 in response to a boot code request of the host 100 as illustrated in FIG. 3.

Figure 6:
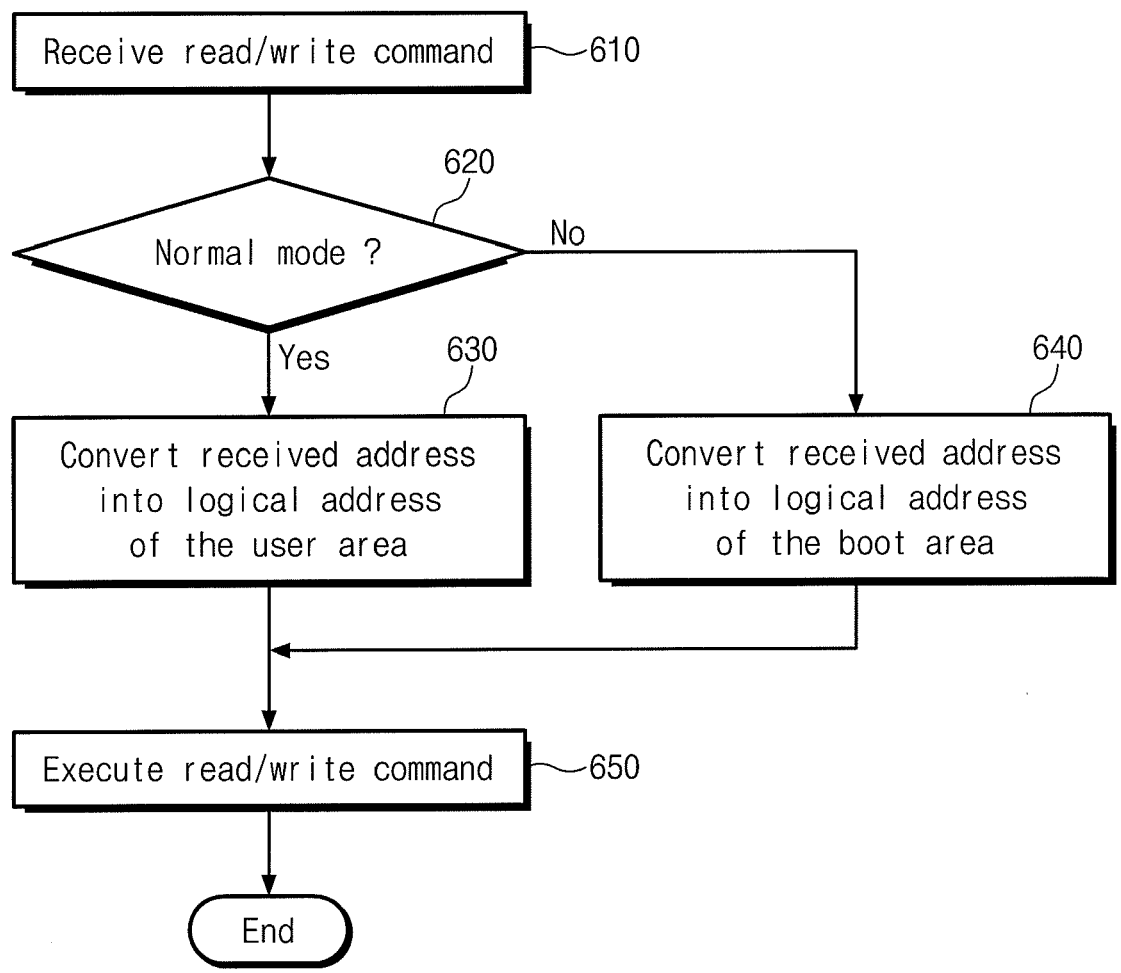
FIG. 6 is a flowchart illustrating an operation sequence of the memory controller illustrated in FIG. 1 according to an exemplary embodiment of the present invention.

FIG. 6 is a flowchart illustrating an operation sequence of the memory controller 200 illustrated in FIG. 1 according to an exemplary embodiment of the present invention.

Referring to FIG. 6, the memory controller 200 receives a read/write command from the host 100 (Step 610). When the operation mode of the memory controller 200 is set to a normal mode (Yes, Step 620), the memory controller 200 converts an address input together with the read/write command to the logical address of the user area (Step 630). When the operation mode of the memory controller 200 is set to a boot mode (No, Step 620), the memory controller 200 converts an inputted address together with the read/write command to the logical address of the boot area 310 (Step 640).

The memory controller 200 writes/reads data to/from a location of the flash memory 300 designated by the converted logical address in response to the read/write command input from the host 100 (Step 650).

The memory controller 200 can write/read data to/from the user area of the flash memory 300 in response to a read/write command input from the host 100 during the normal mode according to the method illustrated in FIG. 6. Also, the memory controller 200 can write/read data to/from the boot area of the flash memory 300 in response to a read/write command input from the host 100 during the boot mode.

According to exemplary embodiments of the present invention, boot data is stored in a memory card in electronic devices. Also, when the host requests an access to boot data/user data stored in the memory card, the boot data/user data can be accessed under control of the memory controller. Therefore, the electronic devices can be booted using the built-in memory card.

The scope of the present invention is not limited to the above exemplary embodiments.

What is claimed is:

1. A memory card device comprising:
a flash memory including a boot area storing boot data for a host, and a user area storing user data including a master boot file, wherein the user area comprises a file allocation table area designated by the boot data; and
a controller converting a logical address received by the host into one of two different physical addresses in accordance with an operating mode which may either be in a boot mode for accessing the boot area or a normal mode for accessing the user area and accessing the boot area at a first of the two different physical addresses in response to a boot file request command from the host and transmitting the boot data to the host when the operating mode is in the boot mode, and accessing the user area at a second of the two different physical addresses in response to an operating command issued by the host and transmitting the user data to the host when the operating mode is in the normal mode.

2. The memory card device of claim 1, wherein the user area further comprises:
   a master boot record area storing the master boot file; and
   a partition boot record area designated by the master boot file and storing partition boot information.

3. The memory card device of claim 2, wherein a start logical address of the boot area is the same as a start logical address of a portion of the user area.

4. The memory card device of claim 2, wherein a start logical address of the boot area is the same as that of the master boot record area.

5. The memory card device of claim 1, wherein the controller converts a logical address for accessing the boot area when the external command is a command for accessing the boot area when the boot file request command is received from the host.

6. The memory card device of claim 1, wherein the controller converts an address received from the host into a logical address for accessing the user area when the operating command issued by the host is a command for accessing the user area.

7. The memory card device of claim 1, wherein the memory card device is a multimedia card.

8. A memory card system comprising:
   a host; and
   a memory card accessed by the host, the memory card comprising:
      a flash memory including a boot area storing boot data for the host, and a user area storing user data including a master boot file, wherein the user area comprises a file allocation table area designated by the boot data; and
      a controller converting a logical address received by the host into one of two different physical addresses in accordance with an operating mode which may either be in a boot mode for accessing the boot area or a normal mode for accessing the user area and accessing the boot area at a first of the two different physical addresses in response to a boot file request command from the host and transmitting the boot data to the host when the operating mode is in the boot mode, and accessing the user area at a second of the two different physical addresses in response to an operating command issued by the host and transmitting the user data to the host when the operating mode is in the normal mode.

9. The memory card system of claim 8, wherein the user area further comprises:
   a master boot record area storing the master boot file; and
   a partition boot record area designated by the master boot file and storing partition boot information.

10. The memory card system of claim 8, wherein the controller generates a logical address for accessing the boot area when the boot file request command is received by the host.

11. The memory card system of claim 8, wherein the controller generates a logical address for accessing the user area when the operating command issued by the host is a command for accessing the user data.

12. A method for controlling a host accessing a memory card comprising a flash memory including a boot area storing boot data for the host, and a user area storing user data including a master boot file, the method comprising:
   receiving a logical address from the host;
   converting the received logical address into one of two different physical addresses in accordance with an operating mode which may either be in a boot mode for accessing the boot area or a normal mode for accessing the user area;
   receiving a boot file request command from the host;
   accessing the boot area at a first of the two different physical addresses in response to the received boot file request command and transmitting the boot data to the host when the operating mode is in the boot mode; and
   accessing the user area at a second of the two different physical addresses in response to an operating command issued by the host and transmitting the user data to the host when the operating mode is in the normal mode,
   wherein the user area comprises a file allocation table area designated by the boot data.

13. The method of claim 12, wherein the operating command issued by the host during the normal mode includes a write command.

14. The method of claim 12, wherein the boot file request command received from the host includes a read command and a read address and the logical address received from the host is a read address.

15. A method for operating a memory card operating in response to a command received from a host, the memory card comprising a flash memory including a boot area storing boot data for the host, and a user area storing user data including a master boot file, the method comprising:
   receiving an access command and a logical address from the host;
   converting the received logical address into one of two different physical addresses in accordance with an operating mode, which may either be in a boot mode for accessing the boot area or a normal mode for accessing the user area, set in accordance with the received access command;
   granting access to the user area at a first of the two different physical addresses during the normal mode when the access command is a command for accessing the user area; and
   granting access to the boot area at a second of the two different physical addresses during the boot mode when the access command is a command for accessing the boot area,
   wherein the user area comprises a file allocation table area designated by the boot data.

16. The method of claim 15, wherein the second of the two different physical addresses corresponds to a start logical address of the boot area.

17. The method of claim 16, wherein the first of the two different physical addresses corresponds to a start logical address of the user area.

18. The method of claim 17, wherein the access command comprises one of a write command or a read command for the flash memory.

19. The method of claim 18, wherein the access command comprises one of a boot mode set command for accessing the boot area, the write command, or the read command.

20. The method of claim 18, wherein the access command comprises one of a normal mode set command for accessing the user area, the write command or the read command for the flash memory.

* * * * *